(12) United States Patent
Janakiraman

(10) Patent No.: US 8,258,991 B2
(45) Date of Patent: Sep. 4, 2012

(54) LOW POWER COMPARATOR FOR USE IN SAR ADCS

(75) Inventor: Seetharaman Janakiraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 154 days.

(21) Appl. No.: 12/857,976

(22) Filed: Aug. 17, 2010

(65) Prior Publication Data

US 2011/0304490 A1 Dec. 15, 2011

(30) Foreign Application Priority Data

Jun. 11, 2010 (IN) ............................ 1624/CHE/2010

(51) Int. Cl.
*H03M 1/38* (2006.01)

(52) U.S. Cl. ........ 341/161; 341/172; 341/155; 341/163; 341/120

(58) Field of Classification Search .................. 341/163, 341/172, 120, 155, 161
See application file for complete search history.

(56) References Cited

U.S. PATENT DOCUMENTS

| | | | | |
|---|---|---|---|---|
| 4,399,426 A * | 8/1983 | Tan | ................ | 341/120 |
| 5,138,319 A | 8/1992 | Tesch | | |
| 5,581,252 A | 12/1996 | Thomas | | |
| 5,684,487 A * | 11/1997 | Timko | ............................ | 341/172 |
| 6,020,841 A * | 2/2000 | Susak | ............................ | 341/163 |
| 6,124,818 A | 9/2000 | Thomas et al. | | |
| 6,268,813 B1 * | 7/2001 | de Wit | ............................ | 341/120 |
| 6,288,664 B1 * | 9/2001 | Swanson | ....................... | 341/155 |
| 6,400,302 B1 * | 6/2002 | Amazeen et al. | ............... | 341/172 |
| 6,559,789 B1 * | 5/2003 | Somayajula | ................... | 341/172 |
| 6,587,066 B1 * | 7/2003 | Somayajula | ................... | 341/172 |
| 6,667,707 B2 * | 12/2003 | Mueck et al. | .................. | 341/172 |
| 6,707,403 B1 * | 3/2004 | Hurrell | ........................... | 341/120 |
| 6,850,181 B1 * | 2/2005 | Tsinker | ......................... | 341/163 |
| 6,879,277 B1 | 4/2005 | Cai | | |
| 6,882,295 B2 | 4/2005 | Leung | | |
| 6,882,298 B2 | 4/2005 | Leung et al. | | |
| 6,914,550 B2 | 7/2005 | Cai | | |
| 6,950,052 B2 | 9/2005 | Leung | | |
| 6,954,170 B2 | 10/2005 | Leung | | |
| 6,956,520 B2 | 10/2005 | Leung et al. | | |
| 6,958,722 B1 | 10/2005 | Janakiraman et al. | | |
| 6,977,607 B2 | 12/2005 | Leung et al. | | |
| 6,985,101 B2 | 1/2006 | Leung et al. | | |
| 7,199,746 B1 * | 4/2007 | Chowdhury et al. | ......... | 341/172 |
| 2004/0246153 A1 | 12/2004 | Leung et al. | | |
| 2004/0246159 A1 | 12/2004 | Leung et al. | | |

FOREIGN PATENT DOCUMENTS

EP 0559657 10/1994
WO WO0104777 1/2001

* cited by examiner

*Primary Examiner* — Jean B Jeanglaude
(74) *Attorney, Agent, or Firm* — John J. Patti; Wade J. Brady, III; Frederick J. Telecky, Jr.

(57) ABSTRACT

Successive approximation register (SAR) analog-to-digital converters (ADCs) generally use one or more comparators to convert an analog signal to a digital signal. These comparators, however, can consume a great deal of power, so it is desirable to have a comparator configuration that consumes less power. Here, a multi-bandwidth comparator is provided, which can be switched between different coarse resolution and fine resolution. By using this single multi-bandwidth comparator, lower power consumption with a small amount of area can be achieved.

20 Claims, 3 Drawing Sheets

LOW POWER COMPARATOR FOR USE IN SAR ADCS

CROSS-REFERENCE TO RELATED APPLICATIONS

This application is claims priority from Indian Patent Application No. 1624/CHE/2010, filed Jun. 11, 2010, which is hereby incorporated by reference for all purposes.

TECHNICAL FIELD

The invention relates generally to analog-to-digital converters (ADCs) and, more particularly, to a successive approximation register (SAR) ADCs.

BACKGROUND

A SAR algorithm is one of the simplest algorithms to find a digital equivalent of a given input voltage. The algorithm uses a binary search method to determine the bits of the digital representation. An 'N' bit SAR ADC generally requires 'N' clock cycles to determine the 'N' bits of the digital output. The conversion process first determines the most significant bit or MSB of the output and progresses one bit at a time until the least significant bit or LSB is resolved. To accomplish this, a comparator is used to determine the sign of the difference between the input and the present approximation. The bit is set to '1' or reset to '0' appropriately in a register. Some SAR converters use redundant bits to "correct" any errors that might have been made in one of the previous steps. These converters typically require more than 'N' clock cycles to complete the process.

The comparator used in this process is generally required to have large gain to amplify the difference to "digital" levels and add as little noise as possible to the conversion process so as to produce same or nearly same output codes for a given input voltage, which means that the comparator generally possesses a minimum gain and a certain bandwidth so as to perform this process accurately within the given clock period. The power dissipated in the comparator is a function of the bandwidth and the noise level that is desired. For a given noise level, power dissipation would also increase with increasing bandwidth.

Some examples of conventional SAR ADCs are Texas Instruments Incorporated's ADS7886, which is a 12-bit, 1 MSPS SAR ADC, and Texas Instruments Incorporated's ADS7883, a 12-bit, 3 MSPS SAR ADC. The 12-bit ADCs output the conversion "on-the-fly." Essentially, these converters finish sending the data out as the process is finished. Such a mode of operation is useful in many applications, but, at 14-bit resolution, this mode might be difficult to support due to transient errors that can occur during some of the bit tests. Thus, it is more desirable to have a redundant bit to correct for any such errors, and it is however desirable to have the option of sending the output "on-the-fly" albeit at lower throughput (i.e., about 1 MSPS).

To accomplish this, adjustments to the configuration of the ADC, namely with the comparator, can be made. If one were to consider a simplified model for a comparator as a single pole amplifier with large gain, it can be shown that the delay in the comparator is a function of the previous input voltage Vp and the current input voltage Vc. The delay of the comparator while determining the sign of a input voltage that changes from a voltage Vp to a voltage Vc is to a good approximation, is proportional to the following:

$$\log\left(\frac{V_p}{V_c}\right) \tag{1}$$

It is possible to "reset" the output of the comparator at the start of the bit test. This would remove the effect of "previous" input and make the delay proportional to the following:

$$\log\left(\frac{V_o}{V_c}\right), \tag{2}$$

where Vo is some constant offset voltage. The largest time used to make a bit decision occurs when voltage Vc is its smallest. In an 'N' bit ADC, voltage Vc is chosen to be fraction of an LSB. It follows that the delay in the comparator increases as 'N' increases. The delay being proportional to logarithmic function of equation (2) is also the same for all the bit tests when bits are "critical."

It is also possible to operate the ADC at a lower resolution for the first few clock cycles. An error correction cycle can then be used to increase the accuracy to a higher level. The redundant bit can be introduced at 'R' bit resolution. It should be noted that this will generally require using extra capacitors in the capacitive digital-to-analog converter (CDAC). The extra capacitor would attenuate the input which can result in lower signal-to-noise ratio (SNR). If 'R' is chosen very small, the cost of achieving the same SNR would be higher power dissipation. This effect can be eliminated if the bits that control the CDAC voltage are adjusted rather than use extra capacitors.

Turning to FIG. 1, a prior implementation SAR ADC 100 that uses comparators having different resolutions can be seen. With SAR ADC 100, the sample-and-hold (S/H) circuit 112 is able to sample and hold the analog input signal AIN based on the sample signal SAMPLE. The CDAC 102, comparators 104 and 106, multiplexer 108, and SAR logic 110 are able to resolve the bits for the digital output DOUT. As shown, ADC 100 employs two comparators 104 and 106. The coarse comparator 106 resolves bits at 'R' bit resolution, and a fine comparator 104 resolves the redundant and the subsequent bits at 'N' bit resolution. The use of two comparators 104 and 106 is not suitable, however, for many applications since the conversion process is "externally" and "uniformly" clocked. In some cases, the power dissipation could increase because we have both comparators 104 and 106 are "on" at the same time.

Therefore, there is a need for a SAR ADC with reduced power dissipation.

Additionally, some other examples of conventional circuits are: U.S. Pat. No. 5,138,319; U.S. Pat. No. 5,581,252; U.S. Pat. No. 5,684,487; U.S. Pat. No. 6,124,818; U.S. Pat. No. 6,879,277; U.S. Pat. No. 6,882,295; U.S. Pat. No. 6,882,298; U.S. Pat. No. 6,914,550; U.S. Pat. No. 6,950,052; U.S. Pat. No. 6,954,170; U.S. Pat. No. 6,956,520; U.S. Pat. No. 6,958,722; U.S. Pat. No. 6,977,607; U.S. Pat. No. 6,985,101; U.S. Patent Pre-Grant Publ. No. 2004/0246153; U.S. Patent Pre-Grant Publ. No. 2004/0246159; European Patent No. EP0559657; and PCT Publ. No. WO1992004777A1.

SUMMARY

A preferred embodiment of the present invention, accordingly, provides a comparator. The comparator comprises a first differential pair that receives a differential input signal; a first impedance network that is coupled to the first differential pair; a second impedance network; a switch network that is coupled between the first differential pair and the second impedance network and that receives a control signal, wherein the switch network varies the bandwidth of the apparatus based at least in part on the control signal; and a second differential pair that is coupled the first impedance network so as to provide an output signal.

In accordance with a preferred embodiment of the present invention, the first differential pair further comprises: a first transistor having a first passive electrode, a second passive electrode, and a control electrode, wherein the control electrode of the first transistor receives a first portion of the differential input signal, and wherein the first passive electrode of the first transistor is coupled to the first impedance network and to the switch network; and a second transistor having a first passive electrode, a second passive electrode, and a control electrode, wherein the control electrode of the first transistor receives a second portion of the differential input signal, and wherein the first passive electrode of the second transistor is coupled to the first impedance network and to the switch network, and wherein the second passive electrode of the first transistor is coupled to the second passive electrode of the second transistor.

In accordance with a preferred embodiment of the present invention, the second differential pair further comprises: a third transistor having a first passive electrode, a second passive electrode, and a control electrode, wherein the control electrode of the third transistor is coupled to the first impedance network; and a fourth transistor having a first passive electrode, a second passive electrode, and a control electrode, wherein the control electrode of the fourth transistor is coupled to the switch network, and wherein the second passive electrode of the third transistor is coupled to the second passive electrode of the fourth transistor.

In accordance with a preferred embodiment of the present invention, the first impedance network further comprises: a first capacitor that is coupled between the control first passive electrode of the first transistor and the control electrode of the third transistor; and a second capacitor that is coupled between the first passive electrode of the second transistor and the control electrode of the fourth transistor.

In accordance with a preferred embodiment of the present invention, the switch network further comprises: a first switch that is coupled to the first passive electrode of the first transistor; and a second switch that is coupled to the first passive electrode of the second transistor.

In accordance with a preferred embodiment of the present invention, the second impedance network further comprises: a third capacitor that is coupled to the first switch; and a fourth capacitor that is coupled the second switch.

In accordance with a preferred embodiment of the present invention, a successive approximation register (SAR) analog-to-digital converter (ADC) is provided. The SAR ADC comprises a sample-and-hold (S/H) circuit that receives an analog input signal and a sample signal; a capacitive digital-to-analog converter (CDAC) that is coupled to the S/H circuit; a comparator having: a first differential pair that is coupled to the CDAC; a first impedance network that is coupled to the first differential pair; a second impedance network; a switch network that is coupled between the first differential pair and the second impedance network and that receives a control signal, wherein the switch network varies the bandwidth of the comparator based at least in part on the control signal; and a second differential pair that is coupled the first impedance network; and SAR logic that is coupled to the comparator, that provides the control signal to the switch network, and that is coupled to the CDAC.

In accordance with a preferred embodiment of the present invention, the first differential pair further comprises: a first transistor having a first passive electrode, a second passive electrode, and a control electrode, wherein the control electrode of the first transistor is coupled to the CDAC, and wherein the first passive electrode of the first transistor is coupled to the first impedance network and to the switch network; and a second transistor having a first passive electrode, a second passive electrode, and a control electrode, wherein the control electrode of the first transistor is coupled to the CDAC, and wherein the first passive electrode of the second transistor is coupled to the first impedance network and to the switch network, and wherein the second passive electrode of the first transistor is coupled to the second passive electrode of the second transistor.

In accordance with a preferred embodiment of the present invention, a SAR ADC is provided. The SAR ADC comprises an S/H circuit that receives an analog input signal and a sample signal; a CDAC that is coupled to the S/H circuit; a comparator having: a first supply rail; a second supply rail; a first differential pair that is coupled to the CDAC and the first supply rail; a first current source that is coupled between the first differential pair and the second supply rail; a first impedance network that is coupled to the first differential pair; a second impedance network that is coupled to the second supply rail; a switch network that is coupled between the first differential pair and the second impedance network and that receives a control signal, wherein the switch network varies the bandwidth of the comparator based at least in part on the control signal; a second differential pair that is coupled the first impedance network and the first supply rail; and a second current source that is coupled between the second differential pair and the second supply rail; and SAR logic that is coupled to the comparator, that provides the control signal to the switch network, and that is coupled to the CDAC.

In accordance with a preferred embodiment of the present invention, the first differential pair further comprises: a first NMOS transistor that is coupled to the first supply rail and the first impedance network at its drain and that is coupled to the CDAC at its gate; and a second NMOS transistor that is coupled to the first supply rail and the first impedance network at its drain, that is coupled to the CDAC at its gate, and that is coupled to the source of the first NMOS transistor at its source.

In accordance with a preferred embodiment of the present invention, the comparator further comprises: a first resistor that is coupled between the first supply rail and the drain of the first NMOS transistor; and a second resistor that is coupled between the first supply rail and the drain of the second NMOS transistor.

In accordance with a preferred embodiment of the present invention, the second differential pair further comprises: a third NMOS transistor that is coupled to the first supply rail at its drain and that is coupled to the first impedance network at its gate; and a fourth NMOS transistor that is coupled to the first supply rail at its drain, that is coupled to the first impedance network at its gate, and that is coupled to the source of the third NMOS transistor at its source.

In accordance with a preferred embodiment of the present invention, the comparator further comprises: a third resistor that is coupled between the first supply rail and the drain of the third NMOS transistor; and a fourth resistor that is coupled between the first supply rail and the drain of the fourth NMOS transistor.

In accordance with a preferred embodiment of the present invention, the first impedance network further comprises: a first capacitor that is coupled between the drain of the first NMOS transistor and the gate of the third NMOS transistor; and a second capacitor that is coupled between the drain of the second NMOS transistor and the gate of the fourth NMOS transistor.

In accordance with a preferred embodiment of the present invention, the switch network further comprises: a first switch that is coupled to the drain of the first NMOS transistor; and a second switch that is coupled to the drain of the second NMOS transistor.

In accordance with a preferred embodiment of the present invention, the second impedance network further comprises: a third capacitor that is coupled between the first switch and the second supply rail; and a fourth capacitor that is coupled the second switch and the second supply rail.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
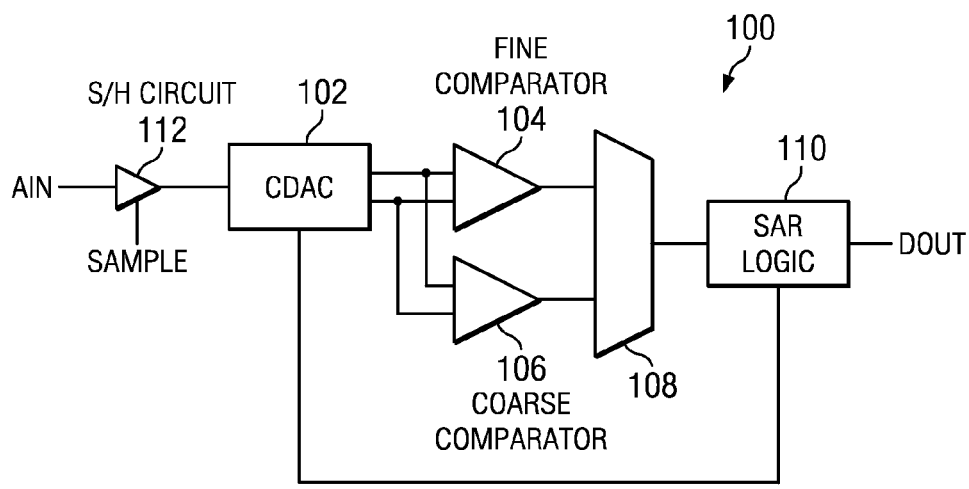
FIG. 1 is an example of a conventional SAR ADC.

Refer now to the drawings wherein depicted elements are, for the sake of clarity, not necessarily shown to scale and wherein like or similar elements are designated by the same reference numeral through the several views.

Figure 2:
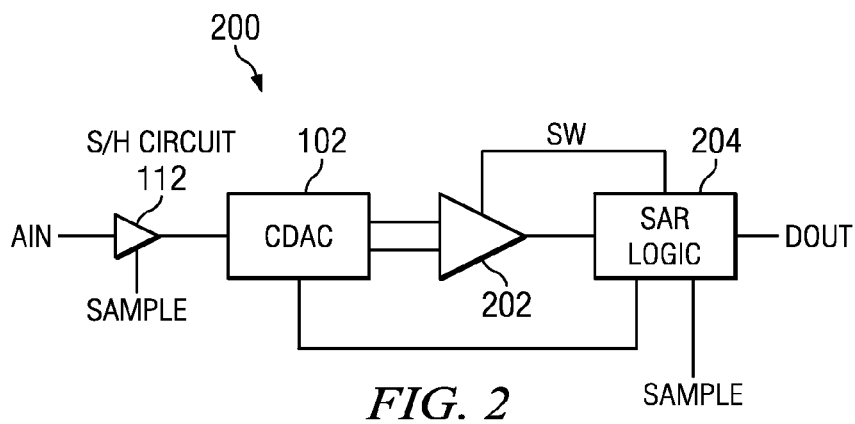
FIG. 2 is an example of a SAR ADC in accordance with a preferred embodiment of the present invention.
Figure 3:
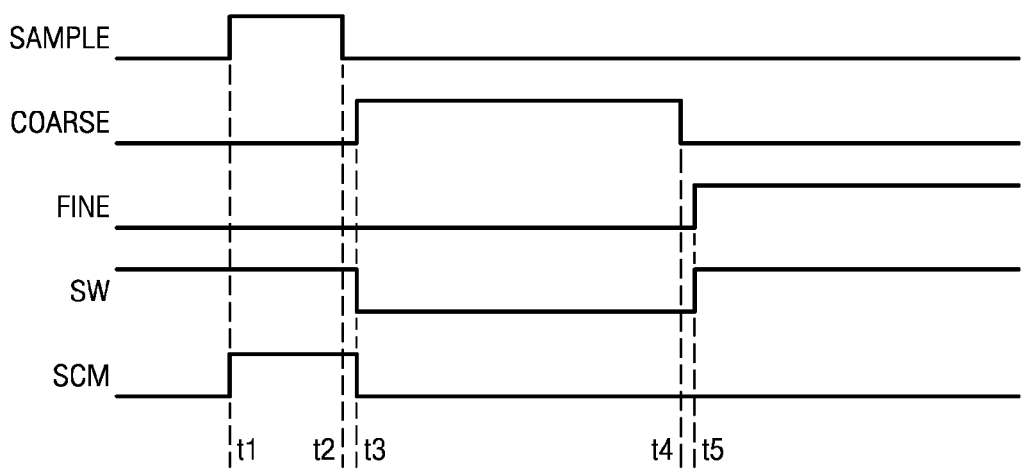
FIG. 3 is a timing diagram for the operation of the SAR ADC of FIG. 2.
Figure 4:
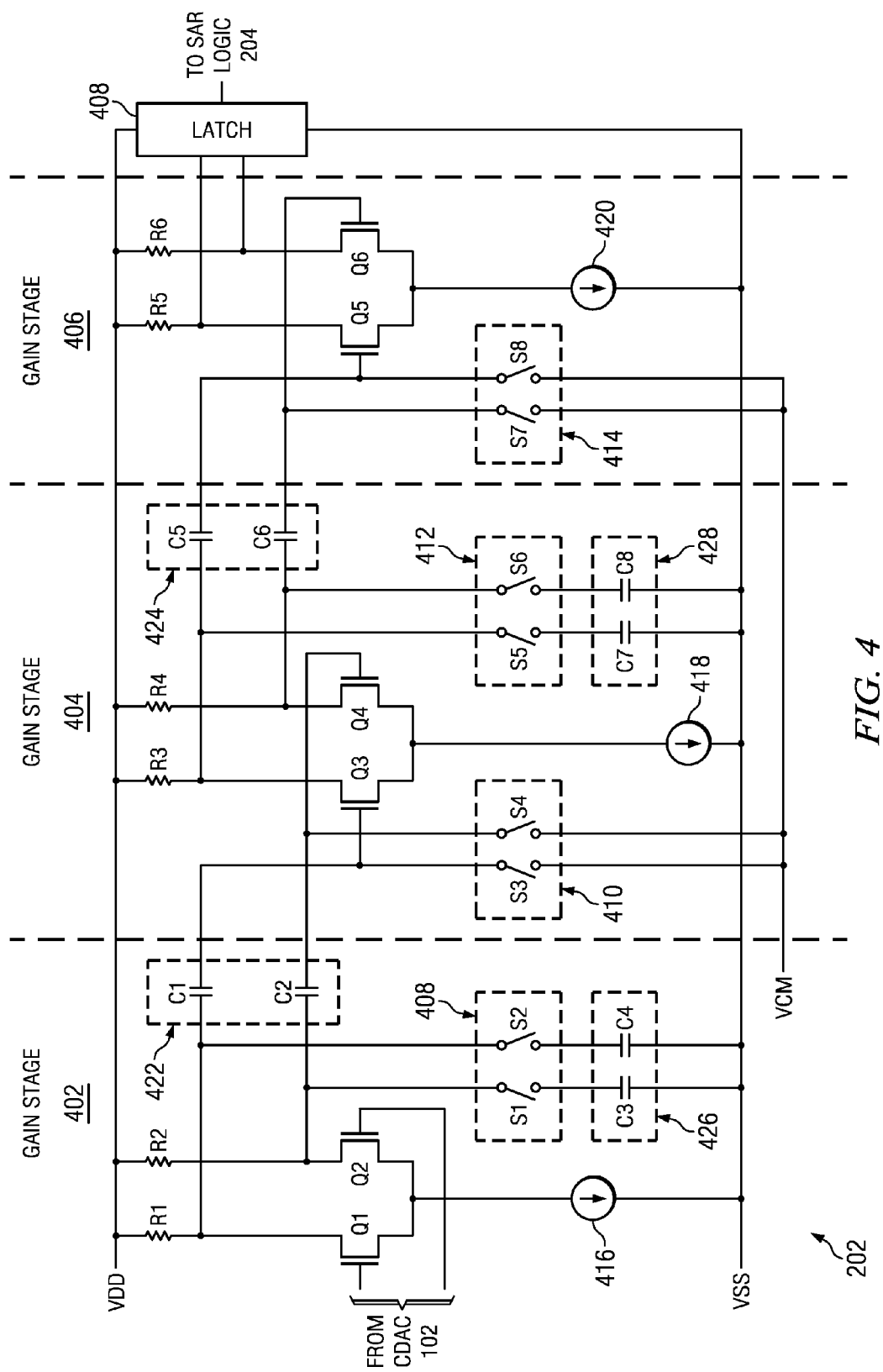
FIG. 4 is an example of the comparator in the SAR ADC of FIG. 2.

Turning to FIGS. 2 through 4, a SAR ADC 200 in accordance with a preferred embodiment of the present invention can be seen. ADC 200 generally comprises S/H circuit 112, CDAC 102, comparator 202, and SAR logic 204. In operation, the S/H circuit 102 samples the analog input signal AIN during the sample or acquisition phase of the sample signal SAMPLE (between times t1 and t2). Following the sample phase, the ADC 200 converts the sampled analog input signal AIN into digital signal DOUT. Explicitly, there two separate portions within the convert phase, a coarse resolution phase (between times t3 and t4) and a fine resolution phase (between from time t5 onward). Time of entry into the coarse and fine resolution phases of the convert phase are controlled by SAR logic 104 (which provides control signal SW to comparator 202).

In order to be able to operate in the coarse and fine resolution phases, comparator 202 is generally configured to have an adjustable bandwidth. To accomplish this, comparator 202 is generally comprised of a latch or an operation transconductance amplifier 408 and cascaded gain stages 402, 404, and 406 that are coupled together with impedance networks 422 and 424 (which can be adjusted through the use of a switch networks 408 and 412 and impedance networks 426 and 428). Each of the gain stages 402, 404, and 406 is generally comprised of a differential pair of NMOS transistors Q1/Q2, Q3/Q4, or Q4/Q5, a current source 416, 418, or 420, and resistors R1/R2, R3/R4, or R5/R6, and each of the impedance networks 422 and 424 are generally comprised of capacitors C1/C2 and C5/C6 (respectively).

During the acquisition or sample phase (when the sample signal SAMPLE is logic high or "1"), comparator 202 is auto-zeroed. During the auto-zeroing of comparator 202, control signals SW and SCM are logic high or "1", which closes switches 51 through S8 of switch networks 408, 410, 412, and 414. The auto-zeroing provides a common mode voltage VCM to capacitors C1, C2, C5, and C6 and generally ensures that the capacitors C1, C2, C5 and C6 are set to a voltage corresponding to an input of 0 volts.

Following the sampling phase (during coarse resolution phase between times t3 and t4), the control signal SW is logic low or "0", which opens switches S1, S2, S5, and S6. As a result, the capacitance is reduced because capacitors C3/C4 and C7/C8 are decoupled from the output of the differential pairs Q1/Q2 and Q3/Q4, respectively. This decrease in capacitance effectively increases the bandwidth of the comparator 202 and increases the noise, making comparator 202 a "coarse comparator." Some charge, however, is injected into capacitors C3, C4, C7, and C8 from to the switches S1, S2, S5, and S6 (respectively), and before entering the fine resolution phase, switches S1, S2, S5, and S6 are closed so that any extra charge that was injected when the switches S1, S2, S5, and S6 were opened flows back into the channel resulting in the output voltage being at a level corresponding to a '0' input. The noise generated in the comparator 202 when its bandwidth has been increased should be lower than the range offered by the redundant bit to generally ensure the error introduced on account of the noise is corrected when the comparator 202 is in the fine resolution phase (when switches S1, S2, S5, and S6 are closed and switches S3, S4, S7, and S8 are open), which has lower bandwidth and lower noise. It is generally practical to operate ADC 200 at 'N−2' bit accuracy in the coarse resolution phase and 'N' bit accuracy in the fine resolution phase. Alternatively, impedance networks 426 and 428 can be coupled to supply rail VDD instead of supply rail VSS, or impedance networks 426 and 428 and their corresponding switch networks 408 and 412 can be coupled between the drains of their corresponding differential pairs Q1/Q2 and Q3/Q4.

Figure 5:
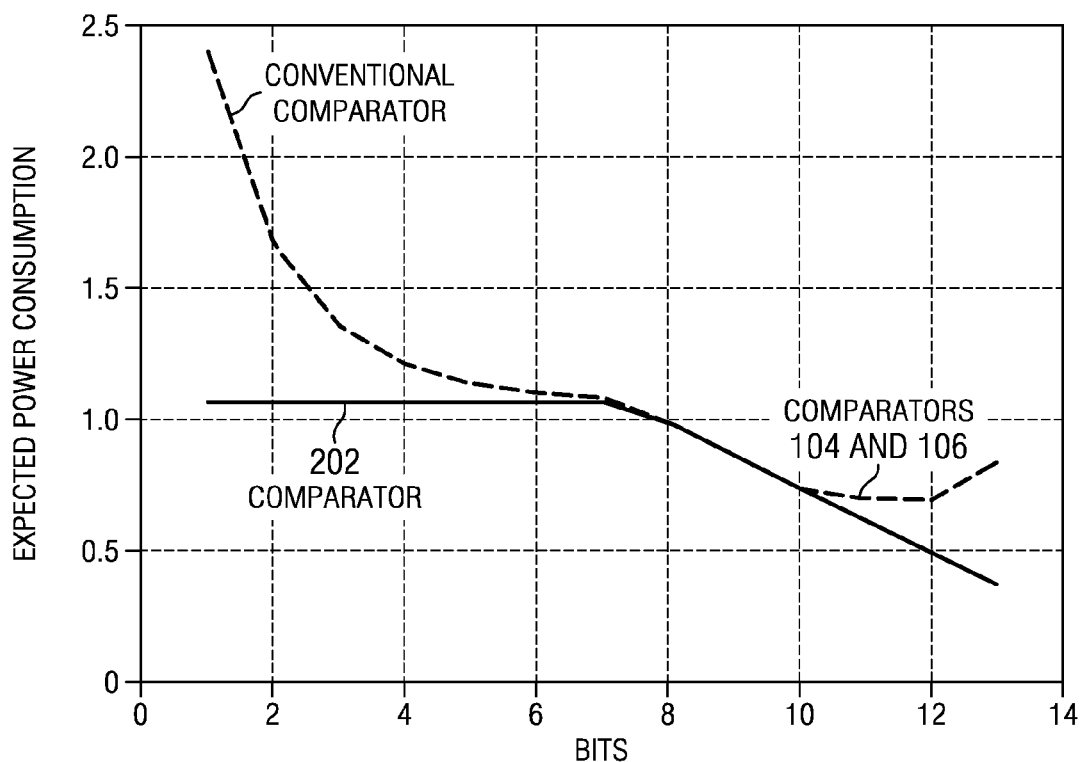
FIGS. 5 and 6 are diagrams depicting relative power dissipation.

Turning to FIG. 5, the power consumption for a conventional comparator, comparators 104 and 106, and comparator 202 can be seen as the length of the coarse resolution phase (for comparator 202) is increased. Specifically, FIG. 5 shows the power consumption as the length of the coarse resolution phase is increased from 1 bit to 13 bits (for a 14-bit SAR ADC). It can be seen that power savings are highest when for the lower bits. As shown in this example, power dissipation for the various architectures is about the same at 7 bits, so it would be desirable to switch from coarse resolution phase to the fine resolution phase at about 7 bits. However, it should be noted that coarse resolution phase that is generally equal to 'N−1' (for an N-bit ADC) will not be practical in most cases.

Figure 6:
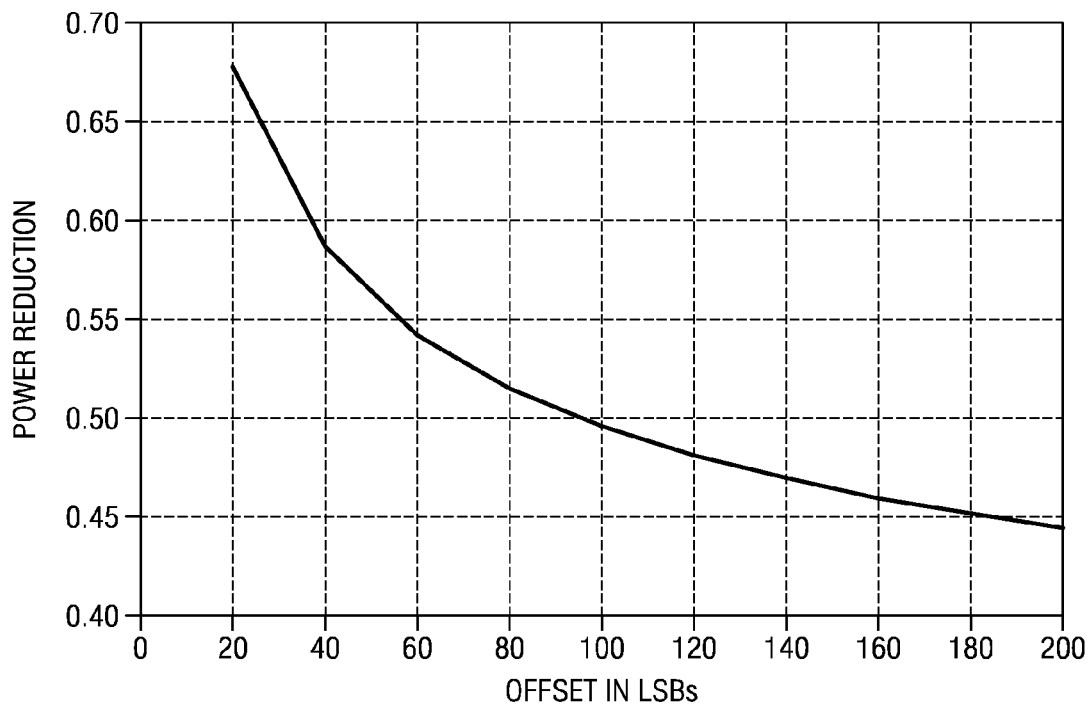

Turning to FIG. 6, it is shown that the variation in the power levels decreases as a function offset voltage for 14-bit ADC, where the coarse resolution phase is 12 bits. As a result, it is generally better to have a lower offset voltage since the bandwidth at the end of the coarse resolution phase would be a much larger fraction of the final bandwidth (which is independent of offset voltage). This would result in much higher noise levels at the end of the coarse resolution phase. Since the bandwidth for the fine resolution phase is independent of offset voltage, this methodology generally allows the power dissipation level to be independent of the offset voltage. Thus, ADC 200 generally has reduced sensitivity to various process parameters (such as threshold voltage mismatch errors, which are the dominant source of offset voltage) and could possibly result in better yield.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A comparator comprising:
   a first differential pair that receives a differential input signal;
   a first impedance network that is coupled to the first differential pair;
   a second impedance network;
   a switch network that is coupled between the first differential pair and the second impedance network and that receives a control signal, wherein the switch network varies the bandwidth of the apparatus based at least in part on the control signal; and
   a second differential pair that is coupled the first impedance network so as to provide an output signal.

2. The comparator of claim 1, wherein the first differential pair further comprises:
   a first transistor having a first passive electrode, a second passive electrode, and a control electrode, wherein the control electrode of the first transistor receives a first portion of the differential input signal, and wherein the first passive electrode of the first transistor is coupled to the first impedance network and to the switch network; and
   a second transistor having a first passive electrode, a second passive electrode, and a control electrode, wherein the control electrode of the first transistor receives a second portion of the differential input signal, and wherein the first passive electrode of the second transistor is coupled to the first impedance network and to the switch network, and wherein the second passive electrode of the first transistor is coupled to the second passive electrode of the second transistor.

3. The comparator of claim 2, wherein the second differential pair further comprises:
   a third transistor having a first passive electrode, a second passive electrode, and a control electrode, wherein the control electrode of the third transistor is coupled to the first impedance network; and
   a fourth transistor having a first passive electrode, a second passive electrode, and a control electrode, wherein the control electrode of the fourth transistor is coupled to the switch network, and wherein the second passive electrode of the third transistor is coupled to the second passive electrode of the fourth transistor.

4. The comparator of claim 3, wherein the first impedance network further comprises:
   a first capacitor that is coupled between the control first passive electrode of the first transistor and the control electrode of the third transistor; and
   a second capacitor that is coupled between the first passive electrode of the second transistor and the control electrode of the fourth transistor.

5. The comparator of claim 4, wherein the switch network further comprises:
   a first switch that is coupled to the first passive electrode of the first transistor; and
   a second switch that is coupled to the first passive electrode of the second transistor.

6. The comparator of claim 5, wherein the second impedance network further comprises:
   a third capacitor that is coupled to the first switch; and
   a fourth capacitor that is coupled the second switch.

7. A successive approximation register (SAR) analog-to-digital converter (ADC) comprising:
   a sample-and-hold (S/H) circuit that receives an analog input signal and a sample signal;
   a capacitive digital-to-analog converter (CDAC) that is coupled to the S/H circuit;
   a comparator having:
      a first differential pair that is coupled to the CDAC;
      a first impedance network that is coupled to the first differential pair;
      a second impedance network;
      a switch network that is coupled between the first differential pair and the second impedance network and that receives a control signal, wherein the switch network varies the bandwidth of the comparator based at least in part on the control signal; and
      a second differential pair that is coupled the first impedance network; and
   SAR logic that is coupled to the comparator, that provides the control signal to the switch network, and that is coupled to the CDAC.

8. The SAR ADC of claim 7, wherein the first differential pair further comprises:
   a first transistor having a first passive electrode, a second passive electrode, and a control electrode, wherein the control electrode of the first transistor is coupled to the CDAC, and wherein the first passive electrode of the first transistor is coupled to the first impedance network and to the switch network; and
   a second transistor having a first passive electrode, a second passive electrode, and a control electrode, wherein the control electrode of the first transistor is coupled to the CDAC, and wherein the first passive electrode of the second transistor is coupled to the first impedance network and to the switch network, and wherein the second passive electrode of the first transistor is coupled to the second passive electrode of the second transistor.

9. The SAR ADC of claim 8, wherein the second differential pair further comprises:
   a third transistor having a first passive electrode, a second passive electrode, and a control electrode, wherein the control electrode of the third transistor is coupled to the first impedance network; and
   a fourth transistor having a first passive electrode, a second passive electrode, and a control electrode, wherein the control electrode of the fourth transistor is coupled to the switch network, and wherein the second passive electrode of the third transistor is coupled to the second passive electrode of the fourth transistor.

10. The apparatus of claim 9, wherein the first impedance network further comprises:
- a first capacitor that is coupled between the control first passive electrode of the first transistor and the control electrode of the third transistor; and
- a second capacitor that is coupled between the first passive electrode of the second transistor and the control electrode of the fourth transistor.

11. The SAR ADC of claim 10, wherein the switch network further comprises:
- a first switch that is coupled to the first passive electrode of the first transistor; and
- a second switch that is coupled to the first passive electrode of the second transistor.

12. The SAR ADC of claim 11, wherein the second impedance network further comprises:
- a third capacitor that is coupled to the first switch; and
- a fourth capacitor that is coupled the second switch.

13. A SAR ADC comprising:
- an S/H circuit that receives an analog input signal and a sample signal;
- a CDAC that is coupled to the S/H circuit;
- a comparator having:
  - a first supply rail;
  - a second supply rail;
  - a first differential pair that is coupled to the CDAC and the first supply rail;
  - a first current source that is coupled between the first differential pair and the second supply rail;
  - a first impedance network that is coupled to the first differential pair;
  - a second impedance network that is coupled to the second supply rail;
  - a switch network that is coupled between the first differential pair and the second impedance network and that receives a control signal, wherein the switch network varies the bandwidth of the comparator based at least in part on the control signal;
  - a second differential pair that is coupled the first impedance network and the first supply rail; and
  - a second current source that is coupled between the second differential pair and the second supply rail; and
- SAR logic that is coupled to the comparator, that provides the control signal to the switch network, and that is coupled to the CDAC.

14. The SAR ADC of claim 13, wherein the first differential pair further comprises:
- a first NMOS transistor that is coupled to the first supply rail and the first impedance network at its drain and that is coupled to the CDAC at its gate; and
- a second NMOS transistor that is coupled to the first supply rail and the first impedance network at its drain, that is coupled to the CDAC at its gate, and that is coupled to the source of the first NMOS transistor at its source.

15. The SAR ADC of claim 14, wherein the comparator further comprises:
- a first resistor that is coupled between the first supply rail and the drain of the first NMOS transistor; and
- a second resistor that is coupled between the first supply rail and the drain of the second NMOS transistor.

16. The SAR ADC of claim 15, wherein the second differential pair further comprises:
- a third NMOS transistor that is coupled to the first supply rail at its drain and that is coupled to the first impedance network at its gate; and
- a fourth NMOS transistor that is coupled to the first supply rail at its drain, that is coupled to the first impedance network at its gate, and that is coupled to the source of the third NMOS transistor at its source.

17. The SAR ADC of claim 16, wherein the comparator further comprises:
- a third resistor that is coupled between the first supply rail and the drain of the third NMOS transistor; and
- a fourth resistor that is coupled between the first supply rail and the drain of the fourth NMOS transistor.

18. The apparatus of claim 9, wherein the first impedance network further comprises:
- a first capacitor that is coupled between the drain of the first NMOS transistor and the gate of the third NMOS transistor; and
- a second capacitor that is coupled between the drain of the second NMOS transistor and the gate of the fourth NMOS transistor.

19. The SAR ADC of claim 18, wherein the switch network further comprises:
- a first switch that is coupled to the drain of the first NMOS transistor; and
- a second switch that is coupled to the drain of the second NMOS transistor.

20. The SAR ADC of claim 19, wherein the second impedance network further comprises:
- a third capacitor that is coupled between the first switch and the second supply rail; and
- a fourth capacitor that is coupled the second switch and the second supply rail.

* * * * *